(12) United States Patent
Ito et al.

(10) Patent No.: US 8,950,614 B2
(45) Date of Patent: Feb. 10, 2015

(54) BIODEGRADABLE RESIN CONTAINER WITH A VACUUM-EVAPORATED FILM AND METHOD OF FORMING A VACUUM-EVAPORATED FILM

(75) Inventors: Takurou Ito, Yokohama (JP); Hiroki Mori, Kawasaki (JP); Kazuhiko Yamazaki, Yokohama (JP)

(73) Assignee: Toyo Seikan Kaisha, Ltd., Tokyo (JP)

( * ) Notice: Subject to any disclaimer, the term of this patent is extended or adjusted under 35 U.S.C. 154(b) by 1057 days.

(21) Appl. No.: 12/668,575

(22) PCT Filed: Jul. 23, 2008

(86) PCT No.: PCT/JP2008/063189
§ 371 (c)(1),
(2), (4) Date: Jan. 11, 2010

(87) PCT Pub. No.: WO2009/022526
PCT Pub. Date: Feb. 19, 2009

(65) Prior Publication Data
US 2010/0200587 A1    Aug. 12, 2010

(30) Foreign Application Priority Data
Aug. 14, 2007 (JP) ................... 2007-211307

(51) Int. Cl.
*B65D 1/40* (2006.01)
*B65D 23/02* (2006.01)
(Continued)

(52) U.S. Cl.
CPC *B65D 23/02* (2013.01); *B05D 1/62* (2013.01); *B05D 7/227* (2013.01); *B65D 65/466* (2013.01); *C23C 16/50* (2013.01); *B05D 7/52* (2013.01)

USPC ............... 220/62.12; 220/62.19; 215/12.1; 215/12.2

(58) Field of Classification Search
USPC .......... 220/62.12, 62.19, 62.2; 215/12.1, 12.2
See application file for complete search history.

(56) References Cited

U.S. PATENT DOCUMENTS 3,647,111 A * 3/1972 Stager et al. ................... 220/660
4,684,553 A * 8/1987 Sasaki et al. ............... 206/524.6
(Continued)

FOREIGN PATENT DOCUMENTS

| EP | 2135734 A1 | 12/2009 |
|---|---|---|
| JP | 2001-018290 A | 1/2001 |

(Continued)

OTHER PUBLICATIONS

Extended European Search Report dated Oct. 18, 2012 for corresponding European Patent Application No. 08791446.1.

*Primary Examiner* — Fenn Mathew
*Assistant Examiner* — Christopher McKinley
(74) *Attorney, Agent, or Firm* — Sughrue Mion, PLLC

(57) ABSTRACT

A biodegradable resin bottle having a container wall (1) including a biodegradable resin and having a vacuum-evaporated film (3) formed on the inner surface of the container wall (1) by a plasma CVD method. The vacuum-evaporated film (3) includes a first hydrocarbon vacuum-evaporated layer (3a) positioned on the inner surface of the container wall and a second hydrocarbon vacuum-evaporated layer (3b) formed on the above hydrocarbon vacuum-evaporated layer (3a). The first hydrocarbon vacuum-evaporated layer (3a) has polar groups introduced therein. The second hydrocarbon vacuum-evaporated layer (3b) exhibits hydrocarbon peaks stemming from CH, $CH_2$ and $CH_3$ in a region of wave numbers of 3200 to 2600 $cm^{-1}$ as measured by FT-IR, has a $CH_2$ ratio of not larger than 35% and a $CH_3$ ratio of not smaller than 40% per the sum of CH, $CH_2$ and $CH_3$ calculated from the hydrocarbon peaks, and has no polar group introduced therein.

4 Claims, 3 Drawing Sheets

(51) Int. Cl.
  *B05D 1/00* (2006.01)
  *B05D 7/22* (2006.01)
  *B65D 65/46* (2006.01)
  *C23C 16/50* (2006.01)
  *B05D 7/00* (2006.01)

(56) References Cited

U.S. PATENT DOCUMENTS

| | | | | |
|---|---|---|---|---|
| 4,756,964 | A * | 7/1988 | Kincaid et al. | 428/408 |
| 5,677,010 | A * | 10/1997 | Esser et al. | 427/489 |
| 5,718,967 | A * | 2/1998 | Hu et al. | 428/216 |
| 5,736,207 | A * | 4/1998 | Walther et al. | 428/34.7 |
| 5,849,401 | A * | 12/1998 | El-Afandi et al. | 428/215 |
| 6,045,916 | A * | 4/2000 | Shimamura et al. | 428/408 |
| 6,080,470 | A | 6/2000 | Dorfman | 428/216 |
| 6,096,809 | A * | 8/2000 | Lorcks et al. | 524/47 |
| 6,140,458 | A * | 10/2000 | Terado et al. | 528/272 |
| 6,180,191 | B1 * | 1/2001 | Felts | 427/569 |
| 6,303,226 | B2 * | 10/2001 | Veerasamy | 428/408 |
| 6,328,805 | B1 * | 12/2001 | Rius | 118/715 |
| 6,589,619 | B1 * | 7/2003 | Nagashima | 428/36.6 |
| 6,706,345 | B1 * | 3/2004 | Yoon | 428/35.7 |
| 6,805,931 | B2 * | 10/2004 | Nagashima | 428/36.6 |
| 6,919,114 | B1 * | 7/2005 | Darras et al. | 428/36.7 |
| 6,958,127 | B1 * | 10/2005 | Suzuki et al. | 264/40.1 |
| 7,166,336 | B1 * | 1/2007 | Mori et al. | 427/577 |
| 7,488,683 | B2 | 2/2009 | Kobayashi et al. | 438/681 |
| 7,700,172 | B2 * | 4/2010 | Renn | 428/36.5 |
| 7,754,302 | B2 * | 7/2010 | Yamasaki et al. | 428/35.7 |
| 7,867,587 | B2 * | 1/2011 | Woerdeman | 428/34.1 |
| 8,026,040 | B2 * | 9/2011 | Wu et al. | 430/272.1 |
| 8,372,491 | B2 * | 2/2013 | Rostaing | 427/570 |
| 2003/0044552 | A1 * | 3/2003 | Komada | 428/35.7 |
| 2003/0087030 | A1 * | 5/2003 | Hama et al. | 427/209 |
| 2003/0124229 | A1 * | 7/2003 | Hama et al. | 426/106 |
| 2003/0157345 | A1 * | 8/2003 | Beldi et al. | 428/447 |
| 2005/0118365 | A1 * | 6/2005 | Miyazaki et al. | 428/34.1 |
| 2005/0151296 | A1 * | 7/2005 | Obuchi et al. | 264/171.13 |
| 2005/0233077 | A1 * | 10/2005 | Lizenberg et al. | 427/248.1 |
| 2006/0051539 | A1 * | 3/2006 | Yamasaki et al. | 428/35.7 |
| 2006/0127655 | A1 | 6/2006 | Kitahara et al. | |
| 2006/0264044 | A1 | 11/2006 | Kobayashi et al. | |
| 2008/0032059 | A1 * | 2/2008 | Zimmerer et al. | 427/458 |
| 2008/0277374 | A1 * | 11/2008 | Miura | 215/384 |
| 2009/0131545 | A1 * | 5/2009 | Hirose et al. | 521/79 |
| 2009/0149560 | A1 * | 6/2009 | Miyagawa et al. | 521/59 |
| 2009/0192236 | A1 * | 7/2009 | Miyagawa et al. | 521/65 |
| 2009/0274918 | A1 * | 11/2009 | Endo et al. | 428/476.3 |
| 2010/0140205 | A1 * | 6/2010 | Ito et al. | 215/12.2 |

FOREIGN PATENT DOCUMENTS

| | | |
|---|---|---|
| JP | 2003-062923 A | 3/2003 |
| JP | 2004-314407 A | 11/2004 |
| JP | 2005-014966 A | 1/2005 |
| JP | 2005-089859 A | 4/2005 |
| JP | 2006-131306 A | 5/2006 |
| JP | 2007-136800 A | 6/2007 |
| WO | 2004/065119 A1 | 8/2004 |
| WO | 2008/149918 A1 | 12/2008 |

* cited by examiner

BIODEGRADABLE RESIN CONTAINER WITH A VACUUM-EVAPORATED FILM AND METHOD OF FORMING A VACUUM-EVAPORATED FILM

CROSS REFERENCE TO RELATED APPLICATION

This application is a National Stage of International Application No. PCT/JP2008/063189, filed Jul. 23, 2008, which claims priority from Japanese Patent Application No. 2007-211307, filed Aug. 14, 2007, the contents of all of which are incorporated herein by reference in their entirety.

TECHNICAL FIELD

This invention relates to a biodegradable resin container and to a method of forming a vacuum-evaporated film. More specifically, the invention relates to a biodegradable resin container having a vacuum-evaporated film on the inner surface of the container wall and to a method of forming a vacuum-evaporated film on the inner surface of the container wall.

BACKGROUND ART

In order to improve properties of various base materials, so far, it is a practice to form a vacuum-evaporated film on their surfaces by a plasma CVD method. In the field of packing materials, it is a known practice to improve the gas-barrier property by forming a vacuum-evaporated film on a plastic base material such as of a container by the plasma CVD method. For example, attempts have been made to improve the gas-barrier property by forming a vacuum-evaporated film of silicon oxide on the surface of a plastic container such as a polyethylene terephthalate (PET) bottle by the plasma CVD method by using a mixed gas of an organosilicon compound and oxygen as a reactive gas.

Here, attention has recently been given to a polylactic acid which is a representative example of a biodegradable plastic in a variety of fields from the standpoint of environmental problems, and bottles made from the polylactic acid have been put to the practical use in the field of packing materials, too. The bottles made from the polylactic acid have a gas-barrier property inferior to that of the PET bottles. Therefore, attempts have been made to improve properties such as gas-barrier property, etc. of the bottles made from the polylactic acid by forming a vacuum-evaporated film thereon.

Excellent gas-barrier property can be exhibited when a silicon oxide film is vacuum-evaporated on the PET bottles. However, various problems arouse when the silicon oxide film is vacuum-evaporated on a container made from such a resin as polylactic acid having a low glass transition point and a low heat resistance. That is, the polylactic acid has a glass transition point (Tg) of 58° C. and its heat resistance is inferior to that of PET (which has a Tg of, for example, 70° C.). That is, in order to obtain barrier property, the silicon oxide film must be vacuum-evaporated by using an oxygen gas and an organometal gas under a high-output condition (vacuum evaporation with a microwave output of, usually, not less than 600 W for 4 seconds or longer). Upon conducting the vacuum evaporation under the above high output condition, however, the bottle wall comprising the polylactic acid is thermally deformed or the wall surface is thermally deteriorated due to the heat of oxygen plasma or other plasma generated in the step of vacuum evaporation arousing such a problem that offensive odor generates in the bottle. Besides, the silicon oxide vacuum-evaporated film is hard and brittle, lacking flexibility, forming hydrophilic group such as silanol group, and cannot favorably follow the deformation of the polylactic acid basic material, cannot be closely adhered to the polylactic acid base material and, besides, has low barrier property against the water.

Vacuum-evaporated films of those other than the silicon oxide have also been studied extensively. For example, patent documents 1 and 2 are proposing hydrocarbon vacuum-evaporated films called diamond-like carbon films (DLC films) formed on the inner surface of a polylactic acid bottle. Further, patent document 3 proposes a polymer-like DLC film formed on the surface of a plastic container, the DLC film chiefly comprising amorphous carbon, and the $CH_3$, $CH_2$ and CH ratios in the film being 25%, 60% and 15%.

Patent document 1: JP-A-2001-18290
Patent document 2: JP-A-2005-14966
Patent document 3: JP-A-2006-131306

DISCLOSURE OF THE INVENTION

Problems to be Solved by the Invention

When compared to the silicon oxide film, the hydrocarbon vacuum-evaporated films proposed by the above prior arts can be formed in short periods of time without causing the container such as the polylactic acid bottle to be thermally deformed or thermally deteriorated and offering an advantage in that a film having barrier property can be vacuum-evaporated on the inner surface of the container wall such as the polylactic acid bottle. Another advantage is higher barrier property against water than that of the silicon oxide film.

However, the known hydrocarbon vacuum-evaporated films proposed by the patent documents 1 to 3 are not still satisfactory concerning the barrier property against oxygen, and desired oxygen-barrier property is not obtained even if they are applied to the bottles of a resin having low oxygen-barrier property, such as polylactic acid. If, for example, used for filling oily contents as represented by edible oils such as frying oil, etc., the oily contents are oxidized and deteriorated due to oxygen that has permeated arousing a problem of offensive taste and offensive odor. The film does not peel even if a PET bottle on which the hydrocarbon film is vacuum-evaporated is filled with an aqueous content. The film, however, often peels if the polylactic acid bottle on which the hydrocarbon film is vacuum-evaporated is filled with the aqueous content. Namely, the polylactic acid bottle leaves a problem that must be solved concerning the adhesion between the plastic base material and the vacuum-evaporated film.

An oil is, usually, oxidized and deteriorated as an oxygen radical bonds to an unsaturated double bond of the oil thereby forming a hydroperoxide which is then decomposed into ketone and carboxylic acid that generate offensive odor. Therefore, the container for containing oils requires, particularly, oxygen-barrier property. Further, the oil absorbs external water and forms micelle which causes cloudiness. Therefore, oxygen-barrier property as well as water-barrier property are required for the products comprising oil only except those oily products that have been emulsified by their nature.

For example, the hydrocarbon vacuum-evaporated film disclosed in the patent document 3 is a polymer-like hydrocarbon film (long-chain branched hydrocarbon film) in which the $CH_3$, $CH_2$ and CH ratios are 25%, 60% and 15% on the basis of the sum of these three components, i.e., having a large $CH_2$ ratio. The PET bottle on which this film is formed exhibits high flexibility, highly close adhesion and barrier property. If this film is vacuum-evaporated on the polylactic acid bottle, however, the vacuum-evaporated film does not closely adhere to the polylactic acid base material and often peels off depending upon the content that is filled. Besides, the polylactic acid bottle has lower oxygen-barrier property than that of the PET bottle and, therefore, is not capable of maintaining satisfactory performance concerning the barrier property.

The film does not peel off even when an aqueous content is filled and preserved in the PET bottle on which the hydrocarbon film has been vacuum-evaporated. However, the film peels off if the aqueous content is filled and preserved in the polylactic acid bottle on which the hydrocarbon film has been vacuum-evaporated. Though this phenomenon has not been correctly clarified yet, it is conjectured that the polylactic acid is a polar resin having a higher O/C ratio (elemental) than that of the PET while the hydrocarbon vacuum-evaporated film is a non-polar film constituted chiefly by C element and H element, and compatibility is not obtained between the hydrocarbon vacuum-evaporated film and the surface of the polylactic acid bottle.

The present inventors have previously proposed a biodegradable resin bottle for filling oily contents, obtained by vacuum evaporating a short-chain branched hydrocarbon film on the inner surface of the bottle wall, the short-chain branched hydrocarbon vacuum-evaporated film having a small $CH_2$ ratio and a large $CH_3$ ratio, i.e., having the $CH_2$ ratio of not larger than 35% and the $CH_3$ ratio of not smaller than 40% per the sum of CH, $CH_2$ and $CH_3$ found by measuring hydrocarbon peaks stemming from CH, $CH_2$ and $CH_3$ relying on FT-IR and calculating the peak intensities of the hydrocarbon peaks after having been corrected by absorbency coefficients (Japanese Patent Application No. 2007-150408).

The biodegradable resin bottle proposed above has the hydrocarbon film vacuum-evaporated thereon while effectively preventing the bottle from being thermally deformed at the time of forming the film. When the aqueous content such as drinking water is filled in the biodegradable resin bottle, however, the film peels off after preserved; i.e., stability of the film is not maintained and, as a result, barrier property is not maintained, either. Therefore, the polylactic acid bottle forming the hydrocarbon vacuum-evaporated film proposed in Japanese Patent Application No. 2007-150408 is limited to containing the oily contents.

It is, therefore, an object of the present invention to provide a biodegradable resin container having barrier property and forming a hydrocarbon film on the inner surface of the container wall while effectively preventing the container from being thermally deformed at the time of forming the film, the film without peeling even when either an oily content or an aqueous content is filled therein and exhibiting excellent barrier property against both oxygen and water, and a method of vacuum evaporating a film on the inner surface of the container wall.

Means for Solving the Problems

According to the present invention, there is provided a biodegradable resin container having a container wall comprising a biodegradable resin and having a vacuum-evaporated film formed on an inner surface of the container wall by a plasma CVD method; wherein
the vacuum-evaporated film includes a first hydrocarbon vacuum-evaporated layer positioned on the inner surface of the container wall and a second hydrocarbon vacuum-evaporated layer formed on the first hydrocarbon vacuum-evaporated layer;
the first hydrocarbon vacuum-evaporated layer has polar groups introduced therein; and
the second hydrocarbon vacuum-evaporated layer exhibits hydrocarbon peaks stemming from CH, $CH_2$ and $CH_3$ in a region of wave numbers of 3200 to 2600 $cm^{-1}$ as measured by FT-IR, has a $CH_2$ ratio of not larger than 35% and a $CH_3$ ratio of not smaller than 40% per the sum of CH, $CH_2$ and $CH_3$ calculated from the hydrocarbon peaks, and has no polar group introduced therein.

The biodegradable resin container for filling oily contents of the invention includes the following preferred embodiments:
(1) The first hydrocarbon vacuum-evaporated layer exhibits a peak stemming from an OH group in a region of wave numbers of 3200 to 3800 $cm^{-1}$ as measured by FT-IR;
(2) The first hydrocarbon vacuum-evaporated layer exhibits hydrocarbon peaks stemming from CH, $CH_2$ and $CH_3$ in a region of wave numbers of 3200 to 2600 $cm^{-1}$ as measured by FT-IR, has a $CH_2$ ratio of not larger than 35% and a $CH_3$ ratio of not smaller than 40% per the sum of CH, $CH_2$ and $CH_3$ calculated from the hydrocarbon peaks;
(3) The first hydrocarbon vacuum-evaporated layer exhibits a peak stemming from the polar group at a ratio of 3 to 30% for the whole peaks present in a region of wave numbers of 2600 to 3800 $cm^{-1}$ as measured by FT-IR;
(4) The first hydrocarbon vacuum-evaporated layer has a thickness of 4 to 90 nm and the second hydrocarbon vacuum-evaporated layer has a thickness of 40 to 180 nm;
(5) The biodegradable resin is a polyhydroxyalkanoate resin;
(6) The biodegradable resin is a polylactic acid; and
(7) The container is a bottle.

According to the invention, there is, further, provided a method of forming a vacuum-evaporated film on the inner surface of a biodegradable resin container by plasma CVD by using microwaves or high-frequency waves, including following steps of:
feeding a reactive gas into an interior of the biodegradable resin container,
forming a first hydrocarbon vacuum-evaporated layer by plasma CVD by using microwaves or high-frequency waves,
feeding a reactive gas for forming a second hydrocarbon vacuum-evaporated layer on said first hydrocarbon vacuum-evaporated layer, and
forming the second hydrocarbon vacuum-evaporated film by plasma CVD by using microwaves or high-frequency waves, wherein:
in the step of forming said first hydrocarbon vacuum-evaporated layer, a mixed gas is used as the reactive gas, said mixed gas containing a gas of at least one kind of hydrocarbon compound selected from an aliphatic unsaturated hydrocarbon and an aromatic hydrocarbon, and a gas of a polar group-containing organic compound or a carbonic acid gas; and
in the step of forming said second hydrocarbon vacuum-evaporated layer, the gas of said hydrocarbon compound is used as the reactive gas without using the gas of the polar group-containing organic compound.

The method of the invention includes the following preferred embodiments:
(1) An oxygen-containing organic compound is used as the polar group-containing organic compound;
(2) Any one of methanol, ethanol or acetone is used as the oxygen-containing organic compound;
(3) Ethylene or acetylene is used as the hydrocarbon compound;

(4) In the step of forming the first hydrocarbon vacuum-evaporated layer, the gas of the hydrocarbon compound and the gas of the polar group-containing organic compound or the carbonic acid gas are fed as reactive gases at a flow rate ratio of 150:1 to 8:1; and (5) The film-forming time is 0.1 to 2.0 seconds in the step of forming the first hydrocarbon vacuum-evaporated layer, and the film-forming time is 1 to 5 seconds in the step of forming the second hydrocarbon vacuum-evaporated layer.

Effects of the Invention

In the present invention, the film vacuum-evaporated on the inner surface of the container wall such as of a bottle of a biodegradable resin is a hydrocarbon vacuum-evaporated film having, as shown in FIG. 1, a two-layer structure comprising a first hydrocarbon vacuum-evaporated layer (3a) formed on the surface of the container wall 1 and a second hydrocarbon vacuum-evaporated layer (3b) formed thereon which are formed by a plasma CVD within short periods of time. Therefore, thermal deformation of the container can be effectively avoided even when the film is formed on the inner surface of the wall of the biodegradable resin container such as of a polylactic acid having a low glass transition point and a low heat resistance.

According to the present invention, further, the first hydrocarbon vacuum-evaporated layer (3a) into which are introduced polar groups as represented by the OH groups exhibits excellently close adhesion to the inner surface of the wall of the container. That is, the biodegradable resin such as the polylactic acid has a higher carbonyl group (>C=O) concentration than that of the PET, and the first hydrocarbon vacuum-evaporated layer (3a) into which are introduced polar groups (—OH, —COOH, etc.) as represented by OH groups forms a hydrogen bond between the carbonyl group of the polylactic acid base material and the OH group of the vacuum-evaporated film, exhibiting excellent bonding strength and excellently close adhesion between the inner surface of the biodegradable resin wall and the vacuum-evaporated film.

Here, as described earlier, if an aqueous content is filled and preserved in a conventional polylactic acid bottle having a hydrocarbon film vacuum-evaporated on the inner surface thereof, a problem arouses in that the film peels off. The peeling of film is a problem specific to the polylactic acid that occurs when a hydrocarbon film is formed on the container made from the polylactic acid and when an aqueous content is filled and preserved therein.

According to the present invention, however, upon introducing polar groups such as OH groups, the first hydrocarbon vacuum-evaporated layer (3a) formed on the inner surface of the container wall forms a hydrogen bond on the surface of the container wall to maintain highly close adhesion to the surface of the container wall. This makes it possible to effectively avoid the peeling of film on the interface between the inner surface of the container wall and the first hydrocarbon vacuum-evaporated layer irrespective of properties of the content, i.e., irrespective of oily or aqueous content that is preserved therein.

The first hydrocarbon vacuum-evaporated layer (3a) is capable of effectively avoiding the problem of peeling of film that occurs when an aqueous content is filled. However, as a result of introducing polar groups such as OH groups, the vacuum-evaporated film exhibits decreased barrier property against the water and oxygen. When an aqueous content is filled, in particular, the required water-barrier property cannot be maintained. However, the present invention has a second short-chain branched hydrocarbon vacuum-evaporated layer (3b) of a hydrocarbon structure containing CH groups, $CH_2$ groups and $CH_3$ groups at predetermined ratios but without containing polar group, that is formed on the first hydrocarbon vacuum-evaporated layer (3a) realizing excellent barrier property against oxygen and water irrespective of oily or aqueous content that is preserved.

That is, the second hydrocarbon vacuum-evaporated layer (3b) has no polar group such as OH group. Introduction of polar groups into the hydrocarbon vacuum-evaporated film decreases its barrier property against oxygen and water. However, this hydrocarbon vacuum-evaporated layer contains no polar group and avoids a decrease in the barrier property. Further, the second hydrocarbon vacuum-evaporated layer (3b) exhibits peaks stemming from CH, $CH_2$ and $CH_3$ in a region of wave numbers of 3200 to 2600 $cm^{-1}$ as measured by FT-IR. Reference should be made, for example, to FIG. 3 which is an FT-IR chart of the second hydrocarbon vacuum-evaporated layer in the vacuum-evaporated film on the polylactic acid base material prepared in Examples described later. FIG. 3 shows a peak stemming from the $CH_3$ bond in a asymmetric oscillation mode at a wave number of 2960 $cm^{-1}$, a peak stemming from the $CH_2$ bond in the non-asymmetric oscillation mode at a wave number of 2925 $cm^{-1}$ and a peak stemming from the CH bond in the non-asymmetric oscillation mode at a wave number of 2915 $cm^{-1}$. By giving attention to the absorption peaks in the same oscillation modes as the non-symmetric oscillation modes, the second hydrocarbon vacuum-evaporated layer (3b) of the present invention is a short-chain branched hydrocarbon film having a composition in which the $CH_2$ ratio is not larger than 35% and the $CH_3$ ratio is not smaller than 40% as calculated based on the peak intensities after having been corrected by absorbency coefficients (as for the detailed calculation method, refer to Examples). Upon forming the second hydrocarbon vacuum-evaporated layer (3b) having the above composition on the first hydrocarbon vacuum-evaporated layer (3a), oxygen-barrier property and water-barrier property are markedly improved as compared to those of when a conventional DLC film is formed.

Though the reason has not been clarified yet why the barrier property is greatly improved by the above composition ratios of hydrocarbon bonds, the present inventors speculate as described below.

That is, the $CH_2$ ratio and the $CH_3$ ratio that are in the above range means that the film has a suitable degree of flexibility and has a short-chain branched structure with much branches, i.e., has a dense structure. Besides, like the first hydrocarbon vacuum-evaporated layer (3a), the second hydrocarbon vacuum-evaporated layer (3b) is a hydrocarbon film and excellently adheres to the first hydrocarbon vacuum-evaporated layer (3a) that is favorably and closely adhered to the inner surface of the container wall. In the present invention, the second hydrocarbon vacuum-evaporated layer (3b) having a dense structure is formed being closely adhered onto the first hydrocarbon vacuum-evaporated layer (3a) that is closely adhered to the inner surface of the container wall. As a result, it is estimated that the barrier property is markedly improved against oxygen and water. For example, the hydrocarbon vacuum-evaporated film proposed in the patent document 3 formed on the inner surface of the wall of the polylactic acid bottle, has a polymer-like hydrocarbon structure (long-chain branched structure) having a $CH_2$ ratio larger than that of the present invention. Therefore, the film composition is not dense but is loose, and a satisfactory oxygen-barrier property is not obtained. Further, the hydrocarbon vacuum-evaporated film of a composition having a low $CH_3$ ratio, e.g., having a zero CH₃ ratio is without flexibility, is very hard, cannot follow deformation in the bottle wall, peels off and, as a result, cannot provide desired barrier property.

As described above, the biodegradable resin bottle of the invention having the vacuum-evaporated film comprising the first hydrocarbon vacuum-evaporated layer (3a) and the second hydrocarbon vacuum-evaporated layer (3b) formed on the inner surface of the container wall features excellent and close adhesion of the film to the surface of the biodegradable container as well as excellent barrier property against oxygen and water irrespective of the kind of the content filled in the container.

When polar groups such as OH groups are introduced into the hydrocarbon vacuum-evaporated layer, further, the vacuum-evaporated film exhibits decreased barrier property but improved transparency. That is, the hydrocarbon vacuum-evaporated film in which no polar group is introduced is colored in brown while the vacuum-evaporated film into which the OH groups are introduced exhibits a color to a reduced degree. Namely, the first hydrocarbon vacuum-evaporated layer (3a) of the invention has transparency superior to that of the ordinary hydrocarbon vacuum-evaporated film and barrier property to some extent. Besides, the second hydrocarbon vacuum-evaporated layer (3b) exhibits excellent barrier property to both oxygen and water. Upon combining the first hydrocarbon vacuum-evaporated layer (3a) and the second hydrocarbon vacuum-evaporated layer (3b) together, it is allowed to decrease the thickness of the second hydrocarbon vacuum-evaporated layer (3b) to a considerable degree. That is, a decrease in the thickness of the second hydrocarbon layer (3b) makes it possible to effectively avoid the problem of color that stems from the second hydrocarbon vacuum-evaporated layer (3b). Therefore, the biodegradable resin container of the invention can be applied even to the use where transparency is required.

BEST MODE FOR CARRYING OUT THE INVENTION

Figure 1:
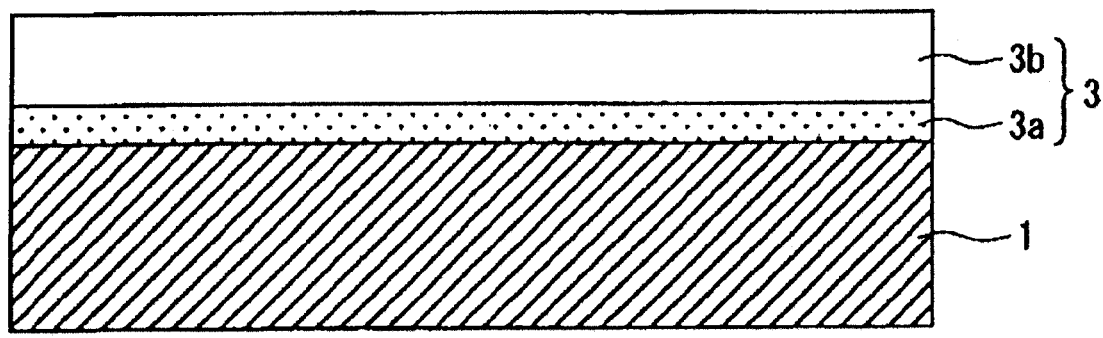
FIG. 1 is a view illustrating the structure in cross section of the wall of a biodegradable resin container of the present invention.
Figure 2:
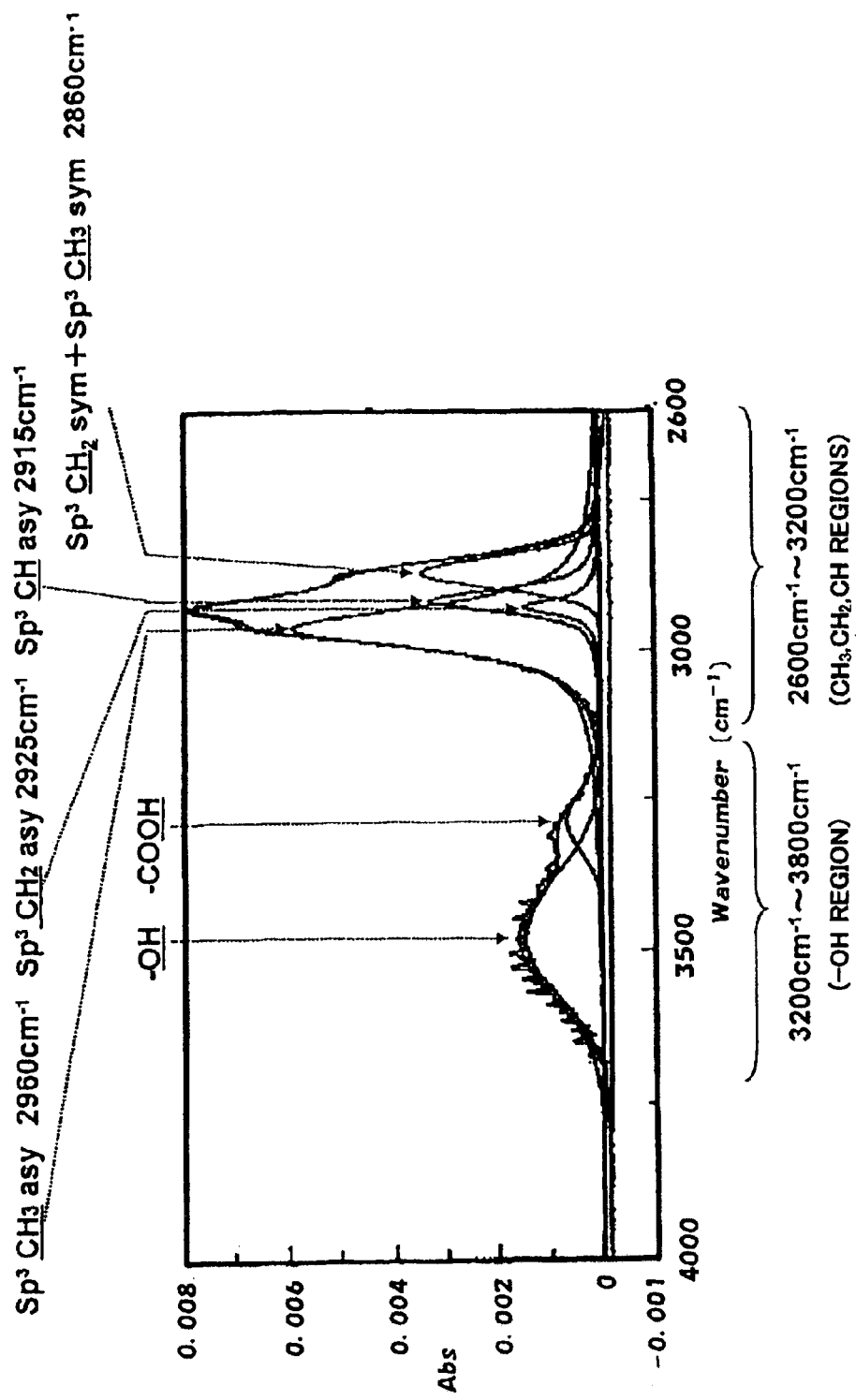
FIG. 2 is an FT-IR chart of a first hydrocarbon vacuum-evaporated layer of a polylactic acid bottle of the invention prepared in Example 4.
Figure 3:
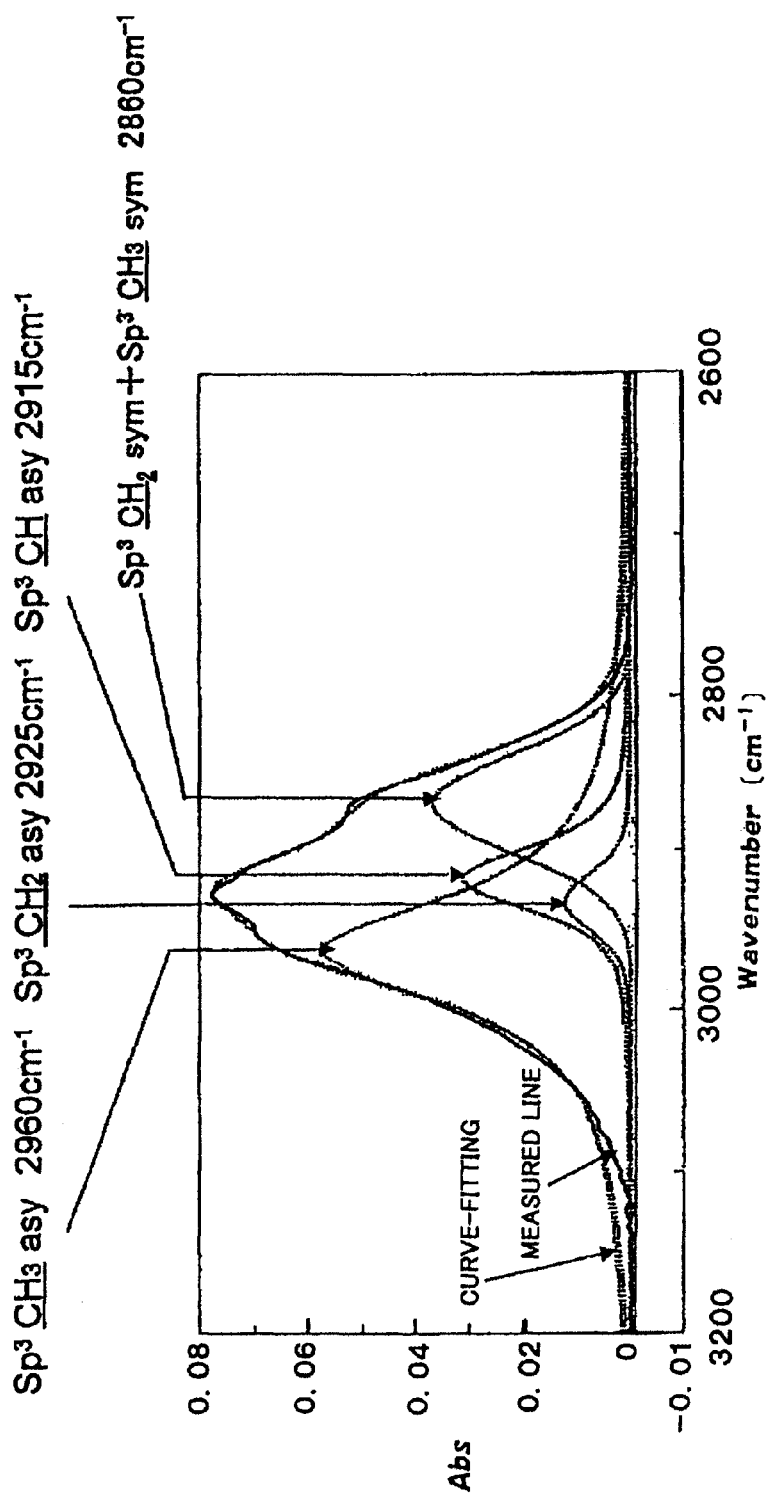
FIG. 3 is an FT-IR chart of a second hydrocarbon vacuum-evaporated layer of the polylactic acid bottle of the invention prepared in Example 4.

The constitution of the biodegradable resin container of the invention will now be described with reference to FIG. 1 which illustrates the structure of the wall thereof in cross section. The container has a hydrocarbon vacuum-evaporated film generally designated at 3 formed by a plasma CVD on the inner surface of a container wall 1 which comprises a biodegradable resin, the hydrocarbon vacuum-evaporated film 3 including a first hydrocarbon vacuum-evaporated layer (3a) formed on the inner surface of the container wall 1 and a second hydrocarbon vacuum-evaporated layer (3b) formed on the first hydrocarbon vacuum-evaporated layer (3a). The container in this form is, usually, a bottle but may be a cup, a jar or the container of any other form.

<Biodegradable Resin>

In the present invention, the biodegradable resin constituting the wall 1 of the container is a polyhydroxyalkanoate resin and a copolymer thereof and, particularly, a polylactic acid from the standpoint of general applicability in the field of packing materials. The polylactic acid may be a 100% poly-L-lactic acid or a 100% poly-D-lactic acid, or a molten blend of the poly-L-lactic acid and the poly-D-lactic acid or may, further, be a random copolymer thereof or a block copolymer thereof. Or, there may be used a copolymer obtained by copolymerizing a glycolic acid which is a polyoxy acid exhibiting biodegrading property and caprolactone, or a blend of polyglycolic acid, cellulose acetate and polycaprolactone.

That is, as described earlier, the biodegradable resin has a glass transition point (Tg) (usually not higher than 60° C.) which is lower than that of the PET, and has a low heat resistance. Therefore, the wall tends to be thermally deformed or the surface of the wall tends to be oxidized and deteriorated by the heat of plasma at the time of vacuum evaporation. According to the present invention, a hydrocarbon vacuum-evaporated film of a bonding composition that will be described later is formed in short periods of time without using oxygen gas, making it possible to attain satisfactory barrier property while effectively avoiding thermal deformation or oxidation and deterioration of the surface of the container wall at the time of vacuum evaporation.

The container to which the film is to be vacuum-evaporated is formed in the same manner as the conventional containers such as PET bottles but using the biodegradable resin. For example, a preform of the shape of a test tube is formed by extrusion-forming or injection-forming the biodegradable resin, followed by blow-forming by using a blowing metal mold to thereby prepare a bottle. The biaxial draw-blow forming may be of either the cold parison system or the hot parison system. Besides, a metal mold heat-setting method can further be applied to heat-set the preform in the metal mold that is heated during the blow forming. Instead of the one-step-blow forming, further, a two-step blow forming may be employed comprising blow-forming the preform in a primary blowing metal mold, heating and contracting the preform, heating the preform again, and draw-blowing the preform into a predetermined bottle shape in a secondary blowing metal mold. Moreover, the molten parison may be extruded by an extruder and may be subjected to the direct blow-forming using a metal mold.

In the case of the container of the form of a cup, a sheet or a preform is formed through the extrusion-forming, injection-forming or compression-forming, and is subjected to the forming through vacuum forming, compressed-air forming or plug-assisted forming.

<Hydrocarbon Vacuum-Evaporated Film 3>

In the present invention, the hydrocarbon vacuum-evaporated film 3 is formed on the inner surface of the wall of the biodegradable resin container by the plasma CVD by using a reactive gas containing a predetermined compound gas, e.g., by the plasma CVD based on a glow discharge by using microwaves or high-frequency waves. When high-frequency waves are used, the container wall on which the film is to be formed must be held by a pair of electrode plates. It is, therefore, desired to employ the plasma CVD that uses microwaves for forming the film without using electrode plates (since a device of a complex structure is required for holding the wall of the container such as bottle between the pair of electrode plates).

According to the above plasma CVD, the biodegradable resin container on which the film is to be formed is disposed in a chamber, a predetermined reactive gas is fed into the container at a predetermined flow rate in a state where the interior and exterior of the container in the chamber is evacuated down to a predetermined degree of vacuum and is maintained in this pressure reduced state, and microwaves are fed with a predetermined output for a predetermined period of time in a state where the predetermined degree of vacuum is maintained to thereby form the film on the inner surface of the container wall. In the case of high-frequency waves, the container wall is maintained between the pair of electrodes, and high-frequency waves are applied with a predetermined output while feeding the reactive gas in the same manner as described above to thereby form the film.

—First Hydrocarbon Vacuum-Evaporated Layer (3a)—

In the hydrocarbon vacuum-evaporated film formed by the plasma CVD of the invention, the first hydrocarbon vacuum-evaporated layer (3a) is formed on the inner surface of the container wall 1 by the plasma CVD by using a gas of a hydrocarbon compound and contains carbon element (C) as a chief component. It is important here that polar groups have been introduced therein. That is, the first hydrocarbon vacuum-evaporated layer (3a) formed on the inner surface of the container wall 1 have polar groups introduced therein and, therefore, forms hydrogen bonds between the polar groups and the carbonyl groups contained in the polylactic acid that constitutes the container wall. Therefore, the junction strength is improved between the first hydrocarbon vacuum-evaporated layer (3a) and the container wall 1, and there is provided a container which effectively prevents the phenomenon of peeling of vacuum-evaporated film even when an aqueous content is filled therein.

The polar groups introduced into the first hydrocarbon film (3a) may be any of those groups capable of forming hydrogen bonds with the carbonyl groups in the biodegradable resin of polylactic acid, such as hydroxyl groups, amino groups, amide groups, carboxyl groups or ester groups. Among them, however, hydroxyl groups (OH groups) and carboxyl groups (COOH groups) are most desired since they can be easily introduced into the film without being decomposed in the film. The presence of the polar groups can be easily confirmed by the FT-IR measurement, i.e., can be observed as absorption peaks stemming from the OH stretching oscillation in a region of wave numbers of 3200 to 3800 $cm^{-1}$. Further, the polar groups can be easily introduced even by using a polar group-containing organic compound (inclusive of a compound that forms polar groups by the reaction at the time of forming the film) or a carbonic acid gas in combination at the time of forming the film.

In the present invention, it is desired that the polar groups are introduced in a suitable amount into the first hydrocarbon vacuum-evaporated layer (3a), e.g., in such an amount that the ratio of peak intensity of peaks 3200 to 3800 $cm^{-1}$ stemming from the polar groups is 3 to 30% relative to the whole peaks (intensity of whole peaks) present in the region of wave numbers of 2600 to 3800 $cm^{-1}$ as measured by FT-IR. If the ratio of peak intensity is smaller than the above range, it means that the polar groups are introduced in small amounts, hydrogen bonds are not formed in sufficient amounts relative to the container wall 1, and the adhesion decreases between the first hydrocarbon vacuum-evaporated layer (3a) and the container wall 1. The vacuum-evaporated film peels off if the container is filled with an aqueous content. If the ratio of peak is larger than the above range, it means that the polar groups have been introduced in unnecessarily large amounts. As a result, the first hydrocarbon vacuum-evaporated layer (3a) exhibits increased hydrophilic property, water easily infiltrates into the first hydrocarbon vacuum-evaporated layer (3a) and, therefore, the first hydrocarbon film easily peels off the container wall. If the polar groups are introduced in an increased amount, on the other hand, transparency is improved but, at the same time, barrier property against oxygen and water decreases. It is, therefore, desired that the peaks of polar groups in the first hydrocarbon vacuum-evaporated layer (3a) are such that the ratio of peak intensity of peaks 3200 to 3800 $cm^{-1}$ stemming from the polar groups is 3 to 30% relative to the whole peaks (intensity of whole peaks) present in the region of wave numbers of 2600 to 3800 $cm^{-1}$ as found by FT-IR.

There is no particular limitation on the composition of hydrocarbon bond units in the first hydrocarbon vacuum-evaporated layer (3a) so far as the polar groups are introduced as described above. It is, however, most desired that the first hydrocarbon vacuum-evaporated layer (3a) has the same hydrocarbon group composition as that of the second hydrocarbon vacuum-evaporated layer (3b) that will be described later since it makes it possible to effectively avoid a decrease in the barrier property caused by the introduction of polar groups. Concretely, the hydrocarbon peaks stemming from CH, $CH_2$ and $CH_3$ are observed by the FT-IR measurement in the region of wave numbers of 3200 to 2600 $cm^{-1}$, and the ratio thereof are calculated from the peak intensities after having been corrected by absorbency coefficients based with the peak intensities as references (for details, refer to Examples). It is desired that the layer has a $CH_2$ ratio of not larger than 35% and a $CH_3$ ratio of not smaller than 40% per the sum of CH, $CH_2$ and $CH_3$ calculated from the hydrocarbon peaks. As will be described in the paragraph of the second hydrocarbon vacuum-evaporated layer (3b) below, the above composition permits the first hydrocarbon vacuum-evaporated layer (3a) to assume a dense structure which is desirable even from the standpoint of close adhesion between the first hydrocarbon vacuum-evaporated layer (3a) and the second hydrocarbon vacuum-evaporated layer (3b).

There is no particular limitation on the thickness of the first hydrocarbon vacuum-evaporated layer (3a). If the thickness is too small, however, close adhesion based on the hydrogen bond is little improved by the polar groups and the film tends to be easily peeled off particularly when an aqueous content is filled. Even if the thickness of the first hydrocarbon vacuum-evaporated layer (3a) is unnecessarily increased, the close adhesion is not improved beyond a predetermined value but rather an increased period of time is required for forming the film resulting in a decrease in the productivity and pushing up the cost. Therefore, the thickness of the first hydrocarbon vacuum-evaporated layer 3a is desirably in a range of 4 to 90 nm.

—Second Hydrocarbon Vacuum-Evaporated Layer (3b)—

In the present invention, the second hydrocarbon vacuum-evaporated layer (3b) is formed on the first hydrocarbon vacuum-evaporated layer (3a) by the plasma CVD by using a gas of a hydrocarbon compound as the reactive gas and contains carbon element (C) as a chief component, but has no polar group introduced therein. That is, introduction of polar groups decreases the barrier property against oxygen and water.

As described already, further, the second hydrocarbon vacuum-evaporated layer (3b) includes the CH bond, $CH_2$ bond and $CH_3$ bond, and has a composition different from that of a hard diamond-like carbon film (DLC film) which does not almost include the $CH_3$ bond. The presence of these bonds can be confirmed by the analysis of peaks of CH, $CH_2$ and $CH_3$ appearing in the region of 3200 to 2600 $cm^{-1}$ as measured by FT-IR.

The presence ratios of the bond structures can be calculated based on the spectra found by TF-IR, and can be found from the values obtained by multiplying the peak intensities by the absorbency coefficients of the respective absorption peaks. Concretely, a short-chain branched structure having the $CH_2$ ratio of not larger than 35% and the $CH_3$ ratio of not smaller than 40% per the total amount of the bonding components, is necessary from the standpoint of barrier property. Upon having the above composition, the second hydrocarbon vacuum-evaporated layer (3b) exhibits a suitable degree of flexibility, excellently adheres to the first hydrocarbon vacuum-evaporated layer (3a) formed on the inner surface of the bottle wall 1 of a biodegradable resin, has a dense structure and, therefore, exhibits excellent barrier property. In the present invention, in particular, the short-chain branched structure has the $CH_2$ ratio of not larger than 35% and the $CH_3$ ratio of not smaller than 40%, more preferably, has the $CH_2$ ratio of not larger than 30% and the $CH_3$ ratio of not smaller than 45%, and most preferably, has the $CH_2$ ratio of not larger than 20% and the $CH_3$ ratio of not smaller than 55% from the standpoint of exhibiting excellent barrier property against oxygen and water. Further, the relative ratios of CH, $CH_2$ and $CH_3$ are, desirably, such that the CH ratio is 10 to 40%, the $CH_2$ ratio is 0 to 35% and the $CH_3$ ratio is 40 to 90%, more desirably, the CH ratio is 10 to 40%, the $CH_2$ ratio is 0 to 30% and the $CH_3$ ratio is 45 to 90%, and further desirably, the CH ratio is 10 to 40%, the $CH_2$ ratio is 0 to 20% and the $CH_3$ ratio is 55 to 90%. The above-mentioned composition quite holds true for the first hydrocarbon vacuum-evaporated layer (3a), too.

In the present invention, it is desired that the second hydrocarbon vacuum-evaporated layer (3b) of the above composition has a thickness in a range of 40 to 180 nm. If the thickness is smaller than the above range, it becomes difficult to maintain required barrier property against oxygen. If the thickness exceeds the above range, the vacuum-evaporated film itself assumes an increased rigidity, becomes no longer capable of following the deformation of the container such as bottle or the like, tends to be cracked or peeled off and, consequently, causes the barrier property to decrease. In the present invention, further, the first hydrocarbon vacuum-evaporated layer (3a) exhibits excellent transparency owing to the introduction of polar groups, and has barrier property to some extent. By combining the first hydrocarbon vacuum-evaporated layer (3a) with the second hydrocarbon vacuum-evaporated layer (3b) together, therefore, it is allowed to decrease the thickness of the second hydrocarbon vacuum-evaporated layer (3b) as much as possible.

<Film-Forming Conditions>

In the present invention, the hydrocarbon vacuum-evaporated film is formed by using a hydrocarbon compound. There is no particular limitation on the hydrocarbon compound provided it can be easily gasified, and a variety of hydrocarbon compounds can be used. From the standpoint of easy gasification, for example, it is desired to use unsaturated aliphatic hydrocarbons and aromatic hydrocarbons. Concrete examples of the unsaturated aliphatic hydrocarbons include alkenes such as ethylene, propylene, butene and pentene; alkynes such as acetylene and methylacetylene; alkadienes such as butadiene and pentadiene; and cycloalkenes such as cyclopentene and cyclohexene. As the aromatic hydrocarbons, there can be exemplified benzene, toluene, xylene, indene, naphthalene and phenanthrene. Among them, ethylene and acetylene are most desired.

To introduce the polar groups into the hydrocarbon vacuum-evaporated film, further, use is made of a gas of the hydrocarbon compound in combination with a gas of the polar group-containing organic compound or a gas of the compound that forms polar groups at the time of forming the film. The film is formed by the plasma CVD by using the mixed gas thereof as the reactive gas. As the compound used for introducing the polar groups, there can be concretely exemplified a variety of alcohols or phenols, amines, amides, carboxylic acids, esters or ketones that form OH groups upon the reaction in forming the film. It is also allowable to use a carbonic acid gas (hereinafter, the gases of these compounds or the carbonic acid gas are often called gases for introducing polar groups). In particular, it is desired to use an oxygen-containing organic compound and, especially, methanol, ethanol, acetone or carbonic acid gas from the standpoint of easy gasification, inexpensive cost and effectively introducing hydroxyl groups or carboxyl groups.

In the present invention, the first hydrocarbon vacuum-evaporated layer (3a) is formed, first. Namely, the film is formed by the plasma CVD by using the reactive gas obtained by mixing a gas of the polar group-containing organic compound into a gas of a hydrocarbon compound. In this case, the mixing ratio of the hydrocarbon compound gas and the gas for introducing polar groups is 150:1 to 8:1 in terms of a flow rate ratio. If the flow rate of the gas for introducing polar groups is small, the peak ratio stemming from the polar groups becomes small in the FT-IR measurement, the junction strength of the vacuum-evaporated film based on the introduction of polar groups is not sufficient, and it becomes difficult to effectively suppress the problem of peeling of film due to the infiltration and accumulation of water. If the gas for introducing polar groups is used in unnecessarily large amounts, on the other hand, the polar groups are excessively introduced, water accumulates between the surface of the container wall and the vacuum-evaporated film becoming a cause of peeling of film.

The second hydrocarbon vacuum-evaporated film (3b) is formed by the plasma CVD without using the gas for introducing polar groups as the reactive gas but using the gas of the hydrocarbon compound only as the reactive gas.

The first hydrocarbon vacuum-evaporated layer (3a) and the second hydrocarbon vacuum-evaporated layer (3b) are formed by the plasma CVD by using the above-mentioned reactive gases, i.e., formed by a glow discharge by utilizing microwaves or high-frequency waves to thereby obtain the desired hydrocarbon vacuum-evaporated film 3 of the two-layer structure. To obtain the above hydrocarbon composition, however, the plasma CVD must be executed based on the glow discharge using microwaves or high-frequency waves maintaining an output relatively higher than that of the case of forming the conventional hydrocarbon vacuum-evaporated films. Concretely speaking, when either the first hydrocarbon vacuum-evaporated layer (3a) or the second hydrocarbon vacuum-evaporated layer (3b) is to be formed, the output of the microwaves or high-frequency waves must be maintained to be not lower than 450 W. In the case of microwaves, it is desired that the output is not smaller than 500 W but is not larger than 1200 W and, more desirably, not smaller than 600 W but is not larger than 900 W. In the case of high-frequency waves, it is desired that the output is from 450 to 950 W. That is, if the output is low, the $CH_2$ ratio exceeds the above-mentioned range and, therefore, it becomes difficult to obtain a dense layer, and barrier property against oxygen and water becomes unsatisfactory. If the output is unnecessarily increased, further, the vacuum-evaporated layers (3a) and (3b) become very hard, and the adhesion is impaired between the first hydrocarbon vacuum-evaporated layer (3a) and the bottle wall 1 or between the first hydrocarbon vacuum-evaporated layer (3a) and the second hydrocarbon vacuum-evaporated layer (3b), and barrier property against oxygen and water becomes unsatisfactory. It is, therefore, desired that the output of the microwaves or high-frequency waves lies in the above range.

In forming the first hydrocarbon vacuum-evaporated layer (3a) by the plasma CVD by using a mixed gas of a hydrocarbon compound gas and a gas for introducing polar groups as the reactive gas according to the invention, further, it is also allowable to execute the plasma CVD with a low output at first, thereafter, gradually increasing the output and, finally, increasing the output to be relatively high as described above. That is, when the film is formed by the plasma CVD with a low output, the polar groups are suppressed from being radically decomposed. As a result, a film structure is formed having polar groups such as OH groups much distributed on the surface side of the container wall 1. Namely, most of the polar groups present in the first hydrocarbon vacuum-evaporated layer (3a) contributes to forming hydrogen bonds with the biodegradable resin constituting the container wall 1 effectively improving the junction strength between the hydrocarbon vacuum-evaporated film 3 (first hydrocarbon vacuum-evaporated layer (3a)) and the container wall. The output in the initial stage may, generally, be about 420 to about 600 W irrespective of either microwaves or high-frequency waves are used.

In the present invention, the plasma reaction is conducted based on the glow discharge using microwaves or high-frequency waves maintaining the above-mentioned relatively high output and, therefore, the film-forming time may be short. In forming the first hydrocarbon vacuum-evaporated layer (3a), for example, the film-forming time for maintaining the thickness in the above-mentioned predetermined range is in a range of, preferably, 0.1 to 2.0 seconds. When microwaves are used, in particular, the film-forming time is in a range of 0.1 to 2.0 seconds and when high-frequency waves are used, the film-forming time is, particularly preferably, in a range of 0.1 to 2.0 seconds. In similarly forming the second hydrocarbon vacuum-evaporated layer (3b), the film-forming time is in a range of, preferably, 1 to 5 seconds. When microwaves are used, in particular, the film-forming time is, particularly preferably, in a range of 1 to 4 seconds and when high-frequency waves are used, the film-forming time is, particularly preferably, in a range of 1 to 5 seconds. If the film-forming time becomes too long, the layers become unnecessarily thick. Besides, the vacuum-evaporated layers (3a) and (3b) are cured, the adhesion is impaired between the container wall and the vacuum-evaporated layers, and barrier property against oxygen and water tends to decrease.

In forming the first hydrocarbon vacuum-evaporated layer (3a), in case the initial output is set to be low to introduce polar groups, the plasma CVD may be executed for only a short period of time even under a high output condition. Namely, the whole film-forming time may be set to lie in the above-mentioned range.

According to the present invention, the plasma CVD is executed using micro waves or high-frequency waves of an output in the above-mentioned range and the film-forming time is set as described above. In forming not only the second hydrocarbon vacuum-evaporated layer (3b) but also the first hydrocarbon vacuum-evaporated layer (3a), therefore, the hydrocarbon vacuum-evaporated film 3 is formed having the $CH$, $CH_2$ and $CH_3$ ratios in the above-mentioned ranges and having the thickness in the above-mentioned ranges. Moreover, polar groups are introduced in a predetermined amount making it possible to obtain the hydrocarbon vacuum-evaporated film that is strongly bonded to the container wall.

When the first hydrocarbon vacuum-evaporated layer (3a) and the second hydrocarbon vacuum-evaporated layer (3b) are formed as described above, it is desired to adjust the flow rate of the reactive gas (hydrocarbon gas) to be in a range of 10 to 100 sccm, and to effect the reaction under the conditions of this range of gas flow, above output and film-forming time. This makes it possible to so adjust the composition that the $CH$, $CH_2$ and $CH_3$ ratios lie in the above-mentioned ranges. Here, "sccm" is an abbreviation of "standard cubic centimeters per minute" and is a value at 0° C. under 1 atm.

According to the present invention that forms the film as described above, the film-forming time is short, and the container wall having a low heat resistance is not thermally deformed or thermally deteriorated at the time of forming the film.

The biodegradable resin container of the invention in which the hydrocarbon vacuum-evaporated film 3 having the above layer structure formed on the inner surface of the container wall 1, exhibits very high barrier property against oxygen and water as compared to that of the container having a known vacuum-evaporated film such as DLC film, effectively prevents the peeling of film caused by the infiltration of water even when the container is filled with an oily content such as frying oil, sesame oil or rape oil that is subject to be oxidized and deteriorated, exhibits excellent gas-barrier property against water and oxygen, and, further, exhibits excellent barrier property against water and oxygen even when the container is filled with an aqueous content such as a hair-washing material containing oil like shampoo, an oily content containing water like an emulsion-type dressing, various juices, soybean sauce or a sauce. Thus, the biodegradable container of the invention exhibits excellent barrier property comparable to that of, for example, a polyethylene terephthalate bottle irrespective of the kinds of the content, and can be used in a wide range of applications.

Excellent barrier property is exhibited even without excessively increasing the thickness of the hydrocarbon vacuum-evaporated film 3 but even by decreasing the thickness thereof. Namely, excellent barrier property is exhibited while maintaining transparency.

EXAMPLES

The invention will be described next by Examples.
Described below are bottles for testing the vacuum evaporation, method of evaluating properties of the bottles and method of analyzing the vacuum-evaporated films used in the following Examples and Comparative Examples.
(Containers for Testing Vacuum Evaporation)
Polylactic acid bottles having a capacity of 400 ml obtained by biaxially draw-blow forming the polylactic acid (PLA) resin preforms.
(Vacuum Evaporation Treatment)
1. First Hydrocarbon Vacuum-Evaporated Layer (3a).
A biodegradable resin bottle on which a film is to be formed was disposed in a chamber. In a state where the interior and exterior of the bottle have been evacuated down to a predetermined vacuum degree in the chamber, a starting gas or a reactive gas which is a mixture of a hydrocarbon compound gas (acetylene) and a polar group-containing organic compound gas (ethanol, etc.) at a ratio of 150:1 to 8:1 (total amount of gas, 30 sccm) was introduced into the bottle (see Examples and Comparative Examples) while outputting microwaves of 2.45 GHz with a maximum output of 615 W for 0.1 to 2 seconds to form a first hydrocarbon vacuum-evaporated layer.
2. Second Hydrocarbon Vacuum-Evaporated Layer (3b).
After the first hydrocarbon vacuum-evaporated film was formed, the gas in the bottle was evacuated down to a predetermined vacuum degree. Next, while feeding acetylene as a starting gas in an amount of 30 sccm, microwaves of 2.45 GHz with a maximum output of 615 W were output for 1 to 4 seconds to form a second hydrocarbon vacuum-evaporated film.

[Evaluation of the Vacuum-Evaporated Bottles]
(Oxygen-Barrier Property)

The bottle for testing the vacuum evaporation was inserted in a gloved box (vacuum-gas substitution device, Model SGV-80) manufactured by AS ONE Co., substituted with a nitrogen gas, sealed with a rubber plug, and was preserved in an environment of 30° C., 25% RH for 7 days. Next, 1 ml of the gas in the container was picked up by using a gas-tight syringe, the oxygen concentration was measured by a gas chromatography for measuring oxygen concentration and was calculated per the surface area of the container to regard it as oxygen permeation amount per day (cc/m$^2$·day). The allowable range of oxygen-barrier property is 12 cc/m$^2$·day or smaller.

(Water-Barrier Property)

The bottle for testing vacuum evaporation was filled with 400 ml of ion-exchanged water at room temperature, hermetically sealed with a rubber plug, and was measured for its weight. Next, the bottle was preserved in an environment of 37° C., 90% RH for 7 days, measured again for its weight which was, then, calculated per the surface area of the container to find a water permeation amount per day (g/m$^2$·day). The allowable range of water-barrier property of the container for containing oily content is 6 g/m$^2$·day.

(Testing the Peeling of Film)

Pieces were cut out from the side wall of the bottle on which the film has been formed, and were cut by using a razor into a grid-like pattern, each square measuring 5 mm. The pieces were dipped in the container containing an edible oil and in the container containing distilled water at 37° C. for one week to observe the peeling of film. The pieces from which the film peeled were evaluated to be X, and the pieces from which the film did not peel were evaluated to be ○.

(Overall Evaluation)

Based on the evaluations in the above tests, the cases were totally evaluated to be ○ when the oxygen-barrier property was not larger than 12 cc/m$^2$·day, the water-barrier property was not larger than 6 g/m$^2$·day and the result of testing the film peeling in oil and water was ○. When even any one of the above items was not satisfied, the overall decision was rendered to be X.

(Analysis of the Hydrocarbon Vacuum-Evaporated Film)
—Preparation of the Sample to be Measured—

Chroloform was introduced into the PLA vacuum-evaporated bottle, and was shaken. Thereafter, the chloroform was recovered and filtered through a 5A-filtering paper. Next, the filtered residue was washed with excess of chloroform. The residue was, thereafter, separated and recovered with chloroform. The vacuum-evaporated film component dispersed in the chloroform was dropped onto a KRS-5 plate and was dried.

—FT-IR Measurement—

By using a microscopic infrared FT-IR apparatus (FT/IR 6300 manufactured by Nihon Bunko Co.), measurement was taken based on the transmission method (frequency range for measurement: 600 cm$^{-1}$ to 4000 cm$^{-1}$).

The measured spectra were corrected for their base lines and were attributed based on a document, B. Dischler, E-Mas Meeting, Jun., 1987, Vol. XVII, 189. A CH$_3$ absorption band (2960 cm$^{-1}$), a CH$_2$ absorption band (2925 cm$^{-1}$) and a CH absorption band (2915 cm$^{-1}$) were selected as absorption peaks of the asymmetric oscillation mode from a range of 2600 cm$^{-1}$ to 3200 cm$^{-1}$. For easy separation of waveforms, further, the curves were fitted from a synthetic function of Gaussian function and Lorentz function based on a method of least squares by using an absorption band in the symmetrical oscillation mode (CH$_2$+CH$_3$ mixed absorption band; 2860 cm$^{-1}$) and a curve-fitting software attached to the microscopic infrared FT-IR apparatus.

Peak intensities of the CH$_3$ absorption band (2960 cm$^{-1}$), CH$_2$ absorption band (2925 cm$^{-1}$) and CH absorption band (2915 cm$^{-1}$) in the non-asymmetric oscillation mode were multiplied by absorbency coefficients, i.e., by 0.31 (2960 cm$^{-1}$), 0.29 (2925 cm$^{-1}$) and 0.14 (2915 cm$^{-1}$) to regard them as structural component quantities (reference document: Polymer Analytical Handbook).

The sum of the CH$_3$ absorption band (2960 cm$^{-1}$) CH$_2$ absorption band (2925 cm$^{-1}$) and CH absorption band (2915 cm$^{-1}$) was set to be 100 for the peak intensities corrected by the absorbency coefficients, and the structural component ratios of CH$_3$, CH$_2$ and CH were found in compliance with the following formula (1).

Here, in order to relatively compare the amounts of CH$_3$, CH$_2$ and CH components, attention was given to the asymmetric oscillation which enables the constituent carbon atoms to be all observed. Further, from a feature in that the CH2 peak intensity in the asymmetric oscillation mode is usually observed stronger than that in the symmetric oscillation mode, attention was given to the asymmetric oscillation. Therefore, the absorption band (CH$_2$+CH$_3$ mixed absorption band; 2860 cm$^{-1}$) in the symmetric oscillation mode was excluded from the calculation.

Example

Methyl Structure $$CH_3(\%)=I(CH_3)/\{I(CH_3)+I(CH_2)+I(CH)\} \cdot 100$$

$$I(CH_3)=(CH_3: 2960 \text{ cm}^{-1}) \text{ curve-fitting value} \times \text{absorbency coefficient } (0.31)$$

$$I(CH_2)=(CH_2: 2925 \text{ cm}^{-1}) \text{ curve-fitting value} \times \text{absorbency coefficient } (0.29)$$

$$I(CH)=(CH: 2915 \text{ cm}^{-1}) \text{ curve-fitting value} \times \text{absorbency coefficient } (0.14) \quad (1)$$

(Measurement of the Amount of Polar Groups)

The infrared absorption peaks of the OH groups over 3200 cm$^{-1}$ to 3800 cm$^{-1}$ were not corrected by absorbency coefficients, but the observed peak intensities were used. The sum of a peak intensity between (2600 cm$^{-1}$ and 3200 cm$^{-1}$) and a peak intensity between (3200 cm$^{-1}$ and 3800 cm$^{-1}$) was used as a denominator and the peak intensity of (3200 cm$^{-1}$ and 3800 cm$^{-1}$) was used as a numerator to thereby calculate a relative amount of OH groups (%).

(Measurement of Film Thickness)

In vacuum evaporating the film on the test bottles, silicon wafers measuring 20 mm×20 mm were inserted and attached to the inner surfaces of the bottles, and the films were vacuum-evaporated on the silicon wafers under the conditions of Examples and Comparative Examples. Next, by using a grazing incidence X-ray measuring apparatus (thin-film X-ray analyzer, X'Pert PROMRD manufactured by PANalytical Co.) and a CuKα ray, the incidence angle was scanned over incidence angles of 0.1° to 2.5° (step: 0.003°) to measure the reflection intensity of X-rays. A curve of the measured X-ray reflection was analyzed by using a software WinGixa attached to the X-ray apparatus to find the thickness of the film.

TABLE 1

| Condition | Blank 1 PLA | Ex. 1 PLA | Ex. 2 PLA | Ex. 3 PLA | Ex. 4 PLA | Ex. 5 PLA | Ex. 6 PLA |
|---|---|---|---|---|---|---|---|
| 1st hydrocarbon vacuum evaporated film (3a) | | | | | | | |
| EtOH gas (sccm) | 0 | 0.2 | 0.7 | 2.5 | 3.3 | 0.7 | 0.7 |
| MeOH gas (sccm) | 0 | 0 | 0 | 0 | 0 | 0 | 0 |
| Acetone gas (sccm) | 0 | 0 | 0 | 0 | 0 | 0 | 0 |
| Acetylene gas (sccm) | 0 | 29.8 | 29.3 | 27.5 | 26.7 | 29.3 | 29.3 |
| Microwave output (W) | — | 615 | 615 | 615 | 615 | 615 | 545 |
| Evaporation time (sec) | — | 0.5 | 0.5 | 0.5 | 0.5 | 0.5 | 0.5 |
| Film thickness (nm) | — | 20 | 20 | 20 | 20 | 20 | 20 |
| Structure $CH_3$ (%) | — | 75 | 74 | 73 | 72 | 74 | 43 |
| Structure $CH_2$ (%) | — | 4 | 5 | 5 | 5 | 5 | 30 |
| Structure CH (%) | — | 21 | 21 | 22 | 23 | 21 | 27 |
| OH groups (%) | — | 3.0 | 10.6 | 25.2 | 30.0 | 10.5 | 10.8 |
| 2nd hydrocarbon vacuum evaporated film (3b) | | | | | | | |
| Acetylene gas (sccm) | 0 | 30 | 30 | 30 | 30 | 30 | 30 |
| Microwave output (W) | — | 615 | 615 | 615 | 615 | 545 | 615 |
| Evaporation time (sec) | — | 3 | 3 | 3 | 3 | 3 | 3 |
| Film thickness (nm) | — | 140 | 140 | 140 | 140 | 138 | 140 |
| Structure $CH_3$ (%) | — | 65.0 | 65.0 | 65.0 | 65.0 | 44.0 | 65.0 |
| Structure $CH_2$ (%) | — | 4.5 | 4.5 | 4.5 | 4.5 | 31.0 | 4.5 |
| Structure CH (%) | — | 30.5 | 30.5 | 30.5 | 30.5 | 25 | 30.5 |
| Oxygen barrier cc/$m^2$ · day | 55.00 | 4.05 | 4.64 | 4.93 | 5.01 | 6.60 | 5.48 |
| Water barrier g/$m^2$ · day | 16.00 | 1.02 | 1.18 | 1.21 | 1.39 | 2.89 | 1.59 |
| Film peel test | | | | | | | |
| In oil | — | ○ | ○ | ○ | ○ | ○ | ○ |
| In water | — | ○ | ○ | ○ | ○ | ○ | ○ |
| Overall evaluation | — | ○ | ○ | ○ | ○ | ○ | ○ |

EtOH: ethanol, MeOH: methanol, Acetone: acetone

TABLE 2

| Condition | Ex. 7 PLA | Ex. 8 PLA | Ex. 9 PLA | Ex. 10 PLA | Ex. 11 PLA | Ex. 12 PLA | Comp. Ex. 1 PLA |
|---|---|---|---|---|---|---|---|
| 1st hydrocarbon vacuum evaporated film (3a) | | | | | | | |
| EtOH gas (sccm) | 0 | 0 | 0.7 | 0.7 | 0.7 | 0.7 | 0 |
| MeOH gas (sccm) | 0.7 | 0 | 0 | 0 | 0 | 0 | 0 |
| Acetone gas (sccm) | 0 | 0.7 | 0 | 0 | 0 | 0 | 0 |
| Acetylene gas (sccm) | 29.3 | 29.3 | 29.3 | 29.3 | 29.3 | 29.3 | 0 |
| Microwave output (W) | 615 | 615 | 615 | 615 | 615 | 615 | — |
| Evaporation time (sec) | 0.5 | 0.5 | 0.1 | 2.0 | 0.1 | 2.0 | — |
| Film thickness (nm) | 20 | 20 | 4.1 | 85 | 4.1 | 85 | — |
| Structure $CH_3$ (%) | 73 | 73 | 69 | 69 | 69 | 69 | — |
| Structure $CH_2$ (%) | 5 | 5 | 7 | 7 | 7 | 7 | — |
| Structure CH (%) | 22 | 22 | 24 | 24 | 24 | 24 | — |
| OH groups (%) | 10.4 | 9.8 | 11.0 | 11.0 | 11.0 | 10.6 | — |
| 2nd hydrocarbon vacuum evaporated film (3b) | | | | | | | |
| Acetylene gas (sccm) | 30 | 30 | 30 | 30 | 30 | 30 | 30 |
| Microwave output (W) | 615 | 615 | 615 | 615 | 615 | 615 | 615 |
| Evaporation time (sec) | 3 | 3 | 3 | 3 | 4 | 1 | 3 |
| Film thickness (nm) | 140 | 140 | 140 | 140 | 180 | 40 | 140 |
| Structure $CH_3$ (%) | 65.0 | 65.0 | 65.0 | 65.0 | 65.0 | 65.0 | 65.0 |
| Structure $CH_2$ (%) | 4.5 | 4.5 | 4.5 | 4.5 | 4.5 | 4.5 | 4.5 |
| Structure CH (%) | 30.5 | 30.5 | 30.5 | 30.5 | 30.5 | 30.5 | 30.5 |
| Oxygen barrier cc/$m^2$ · day | 4.86 | 4.91 | 5.35 | 3.00 | 3.02 | 6.85 | 5.54 |
| Water barrier g/$m^2$ · day | 1.30 | 1.31 | 1.60 | 1.09 | 1.18 | 2.83 | 1.62 |

TABLE 2-continued

| Condition | Ex. 7 PLA | Ex. 8 PLA | Ex. 9 PLA | Ex. 10 PLA | Ex. 11 PLA | Ex. 12 PLA | Comp. Ex. 1 PLA |
|---|---|---|---|---|---|---|---|
| Film peel test | | | | | | | |
| In oil | ○ | ○ | ○ | ○ | ○ | ○ | ○ |
| In water | ○ | ○ | ○ | ○ | ○ | ○ | x |
| Overall evaluation | ○ | ○ | ○ | ○ | ○ | ○ | x |

EtOH: ethanol, MeOH: methanol, Acetone: acetone

TABLE 3

| Condition | Comp. Ex. 2 PLA |
|---|---|
| 1st hydrocarbon vacuum evaporated film (3a) | |
| EtOH gas (sccm) | 0.7 |
| MeOH gas (sccm) | 0 |
| Acetone gas (sccm) | 0 |
| Acetylene gas (sccm) | 29.3 |
| Microwave output (W) | 615 |
| Evaporation time (sec) | 0.5 |
| Film thickness (nm) | 20 |
| Structure $CH_3$ (%) | 74 |
| Structure $CH_2$ (%) | 5 |
| Structure CH (%) | 21 |
| OH groups (%) | 10.6 |
| 2nd hydrocarbon vacuum evaporated film (3b) | |
| Acetylene gas (sccm) | 30 |
| Microwave output (W) | 430 |
| Evaporation time (sec) | 3 |
| Film thickness (nm) | 135 |
| Structure $CH_3$ (%) | 33.8 |
| Structure $CH_2$ (%) | 41.8 |
| Structure CH (%) | 24.4 |
| Oxygen barrier cc/m$^2$ · day | 19.5 |
| Water barrier g/m$^2$ · day | 9.52 |
| Film peel test | |
| In oil | ○ |
| In water | ○ |
| Overall evaluation | X |

EtOH: ethanol, MeOH: methanol,
Acetone: acetone

The following will be obvious from Tables 1 to 3.

As shown in blank 1, the polylactic acid (PLA) bottle having no vacuum-evaporated film was poor in both oxygen-barrier property and water-barrier property.

In Examples 1 to 4, the first hydrocarbon films were vacuum-evaporated on the polylactic acid bottles described above by using an ethanol gas as the polar group-containing organic compound gas and an acetylene gas as the hydrocarbon compound gas at mixing ratios (acetylene gas/ethanol gas) of 149:1, 42:1, 11:1 and 8:1 under the conditions of a microwave output of 615 W and an evaporation time of 0.5 seconds so as to possess film thicknesses, compositions and OH group amounts as shown in Table 1. Next, second hydrocarbon films having thicknesses and compositions as shown in Table 1 were vacuum-evaporated thereon by using the acetylene gas under the conditions of a microwave output of 615 W and an evaporation time of 3 seconds. The oxygen-barrier property, water-barrier property and film peeling were favorable in all of the cases.

In Example 5, the first and second vacuum-evaporated films were formed in the same manner as in Example 2 but forming the second hydrocarbon vacuum-evaporated film with the microwave output of 545 W. In this case, the composition of the second hydrocarbon vacuum-evaporated film possessed a $CH_3$ ratio of 44% and a $CH_2$ ratio of 31%. The oxygen-barrier property, water-barrier property and film peeling were all favorable.

In Example 6, the first and second vacuum-evaporated films were formed in the same manner as in Example 2 but forming the first hydrocarbon vacuum-evaporated film with the microwave output of 545 W. In this case, the composition of the first hydrocarbon vacuum-evaporated film possessed a $CH_3$ ratio of 43% and a $CH_2$ ratio of 30%. The oxygen-barrier property, water-barrier property and film peeling were all favorable.

In Examples 7 and 8, the first and second vacuum-evaporated films were formed in the same manner as in Example 2 but using a methanol gas and an acetone gas as the polar group-containing organic compound gases for forming the first hydrocarbon vacuum-evaporated film. The oxygen-barrier property, water-barrier property and film peeling were all favorable in all cases.

In Examples 9 to 12, the first and second vacuum-evaporated films were formed in the same manner as in Example 2 but varying the evaporation time for forming the first and second hydrocarbon vacuum-evaporated films as shown in Table 2. The oxygen-barrier property, water-barrier property and film peeling were all favorable in all cases.

In Comparative Example 1, the second vacuum-evaporated film was formed in the same manner as in Example 2 but without forming the first hydrocarbon vacuum-evaporated film. The oxygen-barrier property, water-barrier property and film peeling in oil were all favorable but the film peeling in water was poor.

In Comparative Example 2, the first and second vacuum-evaporated films were formed in the same manner as in Example 2 but forming the second hydrocarbon vacuum-evaporated film with the microwave output of 430 W. In this case, the composition of the second hydrocarbon vacuum-evaporated film possessed a $CH_3$ ratio of 33.8% and a $CH_2$ ratio of 41.8%. The film peeling was favorable but the oxygen-barrier property and water-barrier property were poor.

The invention claimed is:

1. A biodegradable resin container having a container wall comprising a polylactic resin and having a vacuum-evaporated film formed on an inner surface of the container wall by a plasma CVD method; wherein
said vacuum-evaporated film includes a first hydrocarbon vacuum-evaporated layer positioned on the inner surface of the container wall and a second hydrocarbon vacuum-evaporated layer formed on said first hydrocarbon vacuum-evaporated layer;
said first hydrocarbon vacuum-evaporated layer has polar groups introduced therein;

said first hydrocarbon vacuum-evaporated layer exhibits a peak stemming from an OH group in a region of wave numbers of 3200 to 3800 cm$^{-1}$ as measured by FT-IR;

said first hydrocarbon vacuum-evaporated layer exhibits hydrocarbon peaks stemming from CH, $CH_2$ and $CH_3$ in a region of wave numbers of 3200 to 2600 cm$^{-1}$ as measured by FT-IR, has a $CH_2$ ratio of not larger than 35% and a $CH_3$ ratio of not smaller than 40% per the sum of CH, $CH_2$ and $CH_3$ calculated from the hydrocarbon peaks; and said second hydrocarbon vacuum-evaporated layer exhibits hydrocarbon peaks stemming from CH, $CH_2$ and $CH_3$ in a region of wave numbers of 3200 to 2600 cm$^{-1}$ as measured by FT-IR, has a $CH_2$ ratio of not larger than 35% and a $CH_3$ ratio of not smaller than 40% per the sum of CH, $CH_2$ and $CH_3$ calculated from the hydrocarbon peaks, and has no polar group introduced therein.

2. The container according to claim 1, wherein said first hydrocarbon vacuum-evaporated layer exhibits a peak stemming from said polar group at a ratio of 3 to 30% for the whole peaks present in a region of wave numbers of 2600 to 3800 cm$^{-1}$ as measured by FT-IR.

3. The container according to claim 1, wherein said first hydrocarbon vacuum-evaporated layer has a thickness of 4 to 90 nm and said second hydrocarbon vacuum-evaporated layer has a thickness of 40 to 180 nm.

4. The container according to claim 1, wherein said container is a bottle.

* * * * *